(12) United States Patent
Bode et al.

(10) Patent No.: US 6,947,803 B1
(45) Date of Patent: Sep. 20, 2005

(54) DISPATCH AND/OR DISPOSITION OF MATERIAL BASED UPON AN EXPECTED PARAMETER RESULT

(75) Inventors: Christopher A. Bode, Austin, TX (US); Alexander J. Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/259,064

(22) Filed: Sep. 27, 2002

(51) Int. Cl.[7] .................. G06F 19/00; H01L 21/00
(52) U.S. Cl. ............... 700/121; 700/100; 700/109; 438/5
(58) Field of Search ............... 700/121, 96, 99, 700/100, 103, 104, 109, 110, 116, 219; 438/4, 438/5

(56) References Cited

U.S. PATENT DOCUMENTS

| | | | |
|---|---|---|---|
| 5,801,965 A * | 9/1998 | Takagi et al. ............... 702/35 |
| 5,907,492 A * | 5/1999 | Akram et al. ............... 700/121 |
| 6,154,711 A * | 11/2000 | Steffan et al. ............... 702/82 |
| 6,349,240 B2 * | 2/2002 | Ogawa et al. ............... 700/121 |
| 6,496,958 B1 * | 12/2002 | Ott et al. ............... 716/4 |
| 6,703,573 B2 * | 3/2004 | Beffa ............... 209/573 |
| 6,727,106 B1 * | 4/2004 | Ankutse et al. ............... 438/5 |
| 2003/0182252 A1 * | 9/2003 | Beinglass et al. ............... 706/45 |
| 2004/0064296 A1 * | 4/2004 | Saxena et al. ............... 703/2 |

* cited by examiner

Primary Examiner—Paul Rodriguez
(74) Attorney, Agent, or Firm—Williams Morgan & Amerson, P.C.

(57) ABSTRACT

A method and an apparatus for affecting dispatch and/or disposition of a workpiece. A process step upon a workpiece is performed based upon a predetermined routing plan. An end-of-line parameter is modeled based upon the process performed upon the workpiece. A workpiece routing/disposition process is performed based upon modeling an end-of-line (EOL) parameter. The workpiece routing/disposition process includes using a controller to modify the routing plan.

38 Claims, 8 Drawing Sheets

DISPATCH AND/OR DISPOSITION OF MATERIAL BASED UPON AN EXPECTED PARAMETER RESULT

BACKGROUND OF THE INVENTION

1. Field of the Invention

This invention relates generally to semiconductor manufacturing, and, more particularly, to a method and apparatus for affecting dispatch and/or disposition of wafers.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a typical flow of processes performed on a semiconductor wafer 105 by a semiconductor manufacturing system is illustrated. A set of processing tools may be identified to be used to process wafers 105 (block 210). At each operation, wafers 105 may be processed by the tools based upon a number of manufacturing factors (block 220). Upon processing of at least a few semiconductor wafers 105, the manufacturing system may acquire metrology data relating to the processed semiconductor wafers 105 (block 230). Upon acquisition of the metrology data, the manufacturing system may then analyze the data to detect errors that may have occurred during the processing of the semiconductor wafers 105 (block 240). Based upon the analysis of the metrology data, the manufacturing system may adjust one or more manufacturing processes based upon the errors detected (block 250). Upon adjustments of the processes, the manufacturing system may continue processing of the semiconductor wafers 105 based upon the predetermined routing scheme (block 260).

Among the problems associated with the prior art methodology includes a lack of efficient reaction, particularly in terms of routing semiconductor wafers 105 throughout a manufacturing facility, based upon the processing errors. Some semiconductor wafers 105 in a batch/lot or some lots themselves may contain errors such that the functional yield relating to devices manufactured from the processed semiconductor wafers 105 may become unacceptably low. However, today's common methodologies generally call for the semiconductor wafers 105 being stepped through various manufacturing areas in a manufacturing facility based upon predetermined tool dedication and dispatch rules. Attempts to correct the errors may be made as they are routed based upon a predetermined routing scheme. However, feedback and/or feed forward corrections made to processes in the manufacturing facility may not be sufficient to improve the yield of the devices produced from the processed semiconductor wafers 105 in an efficient manner.

The present invention is directed to overcoming, or at least reducing, the effects of, one or more of the problems set forth above.

SUMMARY OF THE INVENTION

In one aspect of the present invention, a method is provided for affecting dispatch and/or disposition of a workpiece. A process step upon a workpiece is performed based upon a predetermined routing regime. An end-of-line parameter is modeled based upon the process performed upon the workpiece. A workpiece routing/disposition process is performed based upon modeling an end-of-line (EOL) parameter. The workpiece routing/disposition process includes using a controller to modify the routing plan. In another aspect of the present invention, a system is provided for affecting dispatch and/or disposition of a workpiece. The system includes a processing tool to process a workpiece. The system also includes a process controller operatively coupled to the processing tool. The controller is capable of performing a workpiece routing/disposition process based upon a fault detection analysis. The workpiece routing/disposition process includes determining a disposition of the workpiece and modifying the routing plan.

In another aspect of the present invention, an apparatus is provided for affecting dispatch and/or disposition of a workpiece. The apparatus includes a process controller adapted to perform a workpiece routing/disposition process based upon a fault detection analysis, the workpiece routing/disposition process comprising determining a disposition of the workpiece and modifying the routing plan.

In yet another aspect of the present invention, a computer readable program storage device encoded with instructions is provided for affecting dispatch and/or disposition of a workpiece. A computer readable program storage device encoded with instructions that, when executed by a computer, performs a method, which comprises: performing a process step upon a workpiece based upon a predetermined routing regime; modeling an end-of-line parameter based upon the process performed upon the workpiece; and performing a workpiece routing/disposition process based upon modeling an end-of-line (EOL) parameter. The workpiece routing/disposition process includes using a controller to modify the routing plan.

BRIEF DESCRIPTION OF THE DRAWINGS

The invention may be understood by reference to the following description taken in conjunction with the accompanying drawings, in which like reference numerals identify like elements, and in which.

Figure 1:
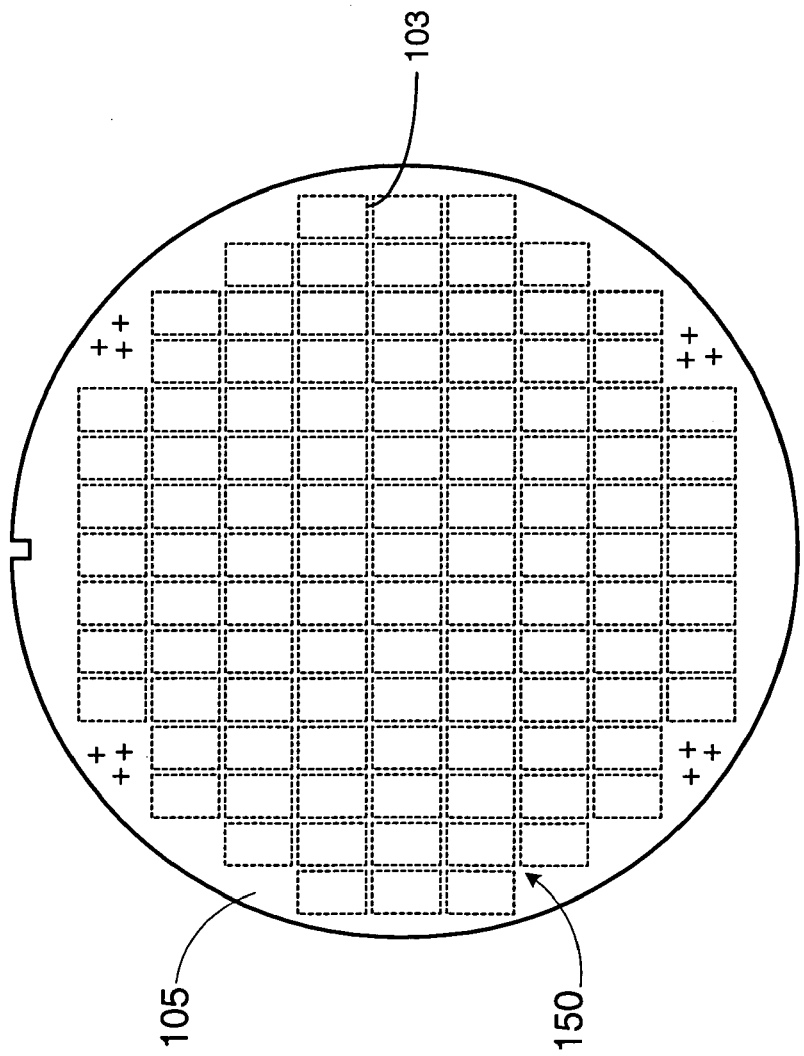
FIG. 1 is a simplified diagram of a prior art semiconductor wafer being processed.
Figure 2:
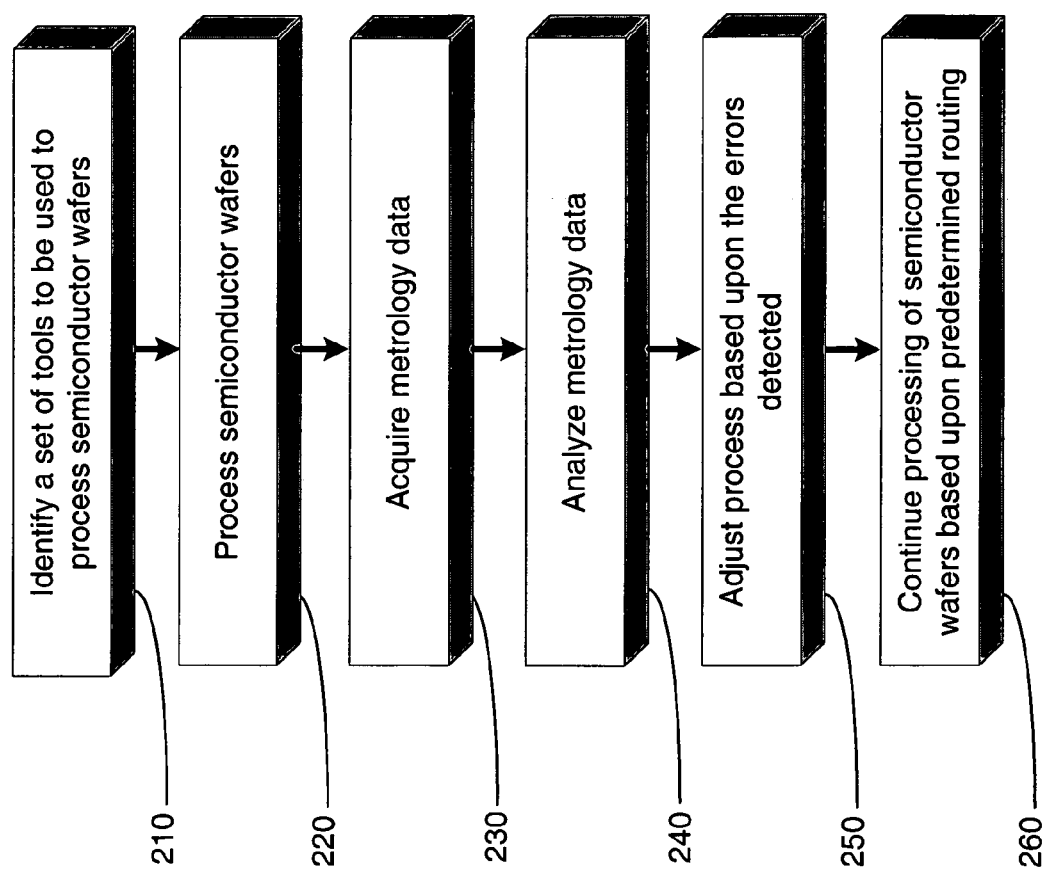
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, workpieces (e.g., semiconductor wafers 105, semiconductor devices, etc.) are stepped through multiple manufacturing process tools. Embodiments of the present invention provide for performing a prediction function relating to an outcome of yields and/or other end-of-line parameters relating to devices produced from processed semiconductor wafers 105. Predictions relating to a functional yield, such as device performance parameters (e.g., speed, grade, power consumption parameters, etc.) may be made and a responsive dispatch and/or disposition of the semiconductor wafers 105 and/or batch of semiconductor wafers 105 may be performed.

Semiconductor wafers 105 that may provide acceptable yield of devices produced from semiconductor wafer 105, may be dispatched to selected processing tools in a manufacturing facility. Likewise, semiconductor wafers 105 that may provide unacceptable levels of yields, may be sent to rework stations, and/or may be scrapped based upon one or more business rules, such as rules relating to the cost of the devices produced from the semiconductor wafers 105. Utilizing embodiments of the present invention, the dispatch/disposition of semiconductor wafers 105 may be based upon predictions of outcome relating to devices manufactured from the semiconductor wafers 105, and/or quantification of the economic value of the predicted resultant products (i.e., a projected yield versus the cost of continuing production on certain semiconductor wafers 105) may be made to improve the efficiency of reaction to semiconductor wafer 105 conditions during processing of the semiconductor wafers 105.

Figure 3:
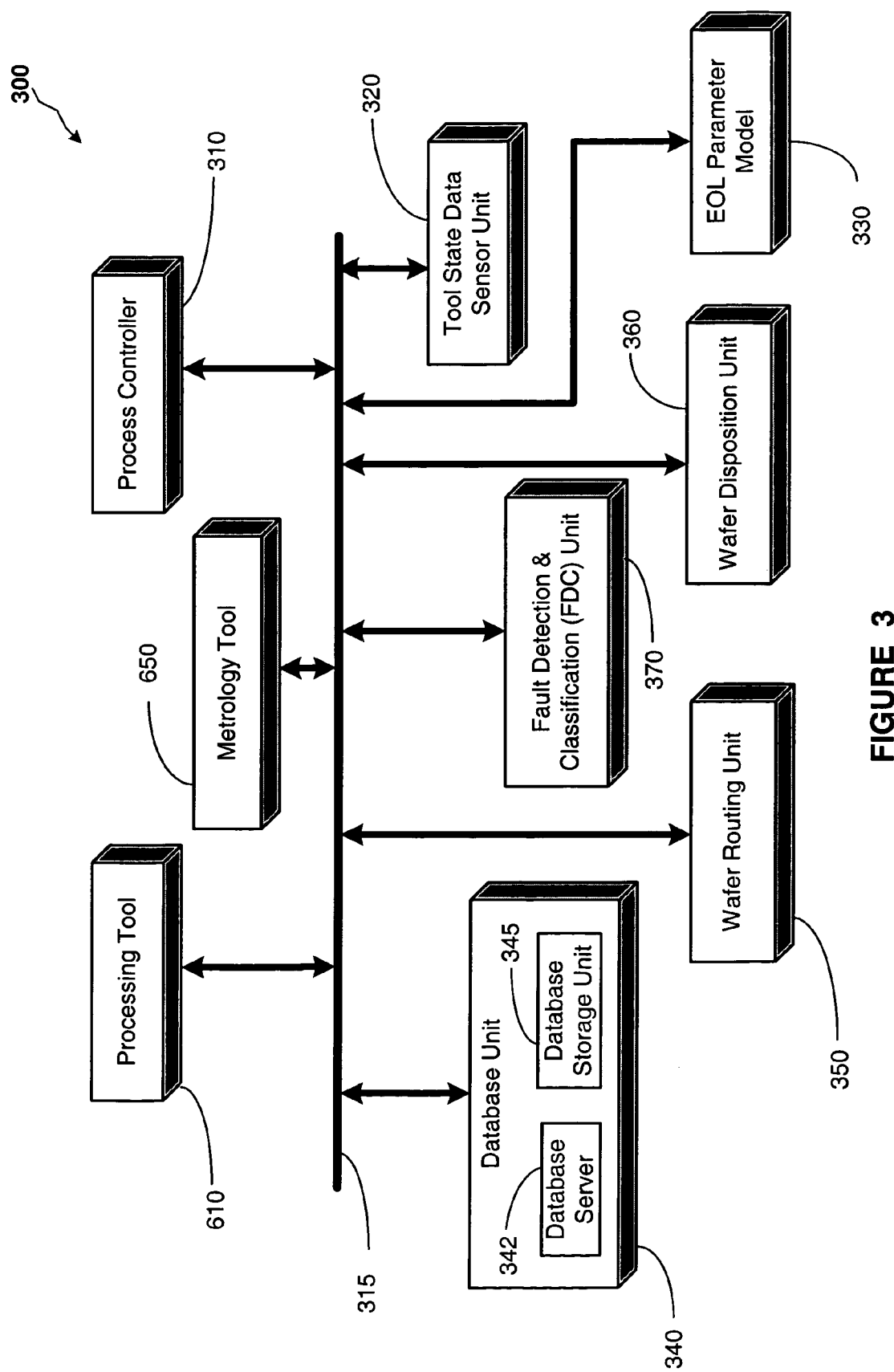
FIG. 3 provides a block diagram representation of a system in accordance with one illustrative embodiment of the present invention.

Turning now to FIG. 3, a block diagram depiction of a system 300 in accordance with embodiments of the present invention is illustrated. A process controller 310 in the system 300 is capable of controlling various operations relating to a processing tool 610. The system 300 is capable of acquiring manufacturing related data, such as metrology data, related to processed semiconductor wafers 105, tool state data, and the like. The system 300 may also comprise a metrology tool 650 to acquire metrology data related to the processed semiconductor wafers 105.

The system 300 may also comprise a database unit 340. The database unit 340 is provided for storing a plurality of types of data, such as manufacturing-related data, data related to the operation of the system 300 (e.g., the status of the processing tool 610, the status of semiconductor wafers 105, etc.). The database unit 340 may store tool state data relating to a plurality of process runs performed by the processing tool 610. The database unit 340 may comprise a database server 342 for storing tool state data and/or other manufacturing data related to processing semiconductor wafers 105, into a database storage unit 345.

The system 300 may also comprise a tool state data sensor unit 320 for acquiring tool state data. The tool state data may include pressure data, temperature data, humidity data, gas flow data, various electrical data, and the like, related to operations of the processing tool 610. Exemplary tool state data for an etch tool may include gas flow, chamber pressure, chamber temperature, voltage, reflected power, backside helium pressure, RF tuning parameters, etc. The tool state data may also include data external to the processing tool 610, such as ambient temperature, humidity, pressure, etc. A more detailed illustration and description of the tool state data sensor unit 320 is provided in FIG. 4 and accompanying description below.

The system 300 may also comprise an end-of-line (EOL) parameter model 330, a wafer routing unit 350, wafer disposition unit 360, and a fault detection and classification (FDC) unit 370. The FDC unit 370 is capable of providing data relating to faults during processing of semiconductor wafers 105. Fault detection analysis performed by the FDC unit 370 may include analysis of tool state data and/or metrology data. The FDC unit 370 may correlate particular tool state data to errors detected on the processed semiconductor wafer 105 by analyzing the metrology tool data. For example, particular errors, such as critical dimension errors discovered on the processed semiconductor wafers 105 may be correlated to particular gas flow rates or temperature data relating to tool state data. Based upon the fault detection analysis provided by the FDC unit 370, the system 300 may perform a modification to a previously or predetermined routing scheme determined by the system 300.

The EOL parameter model 330 is capable of modeling a plurality of end-of-line parameters based upon the condition of the processed semiconductor wafers 105 in the manufacturing line associated with the system 300. The EOL parameter model 330 may use metrology data analysis and/or fault detection analysis to project a functional yield of devices that are to be manufactured from the processed semiconductor wafers 105. Therefore, the EOL parameter model 330 may model data relating to the functional data relating to the functional yield of devices produced from the processed semiconductor wafers 105, such as device performance characteristics (e.g., speed, grade, power consumption, etc.). Based upon the modeling of the EOL parameters provided by the EOL parameter model 330, the system 300 may perform modifications to predetermined routing schemes and dispatch the semiconductor wafers 105 to alternate processing locations associated with the system 300. Data from the EOL parameter model 330 may also be used to determine a disposition of one or more semiconductor wafers 105 being processed, such as a decision to scrap particular semiconductor wafers 105. Device performance characteristics, manufacturing cost issues, and other business rules may be factors that may be used to determine the dispatch and disposition of semiconductor wafers 105.

The wafer routing unit 350 may determine alternative routes towards which particular semiconductor wafers 105 may be directed based upon data from the EOL parameter model 330. For example, if the EOL parameter model 330 predicts that a particular set of semiconductor wafers 105 may result in high yields, the wafer routing unit 350 may redirect those selected semiconductor wafers 105 to preferred manufacturing tools in the system 300. Additionally, the wafer routing unit 350 may redirect other semiconductor wafers 105 to less desirable processing tools, rework procedures, or otherwise.

The wafer disposition unit 360 may use data from the EOL parameter model 330 to determine particular disposition of semiconductor wafers 105 based upon predicted EOL parameters. For example, the wafer disposition unit 360 may determine to scrap particular semiconductor wafers 105 based upon business rules that may indicate that the economic cost of continuing to process certain semiconductor wafers 105 is greater than the cost of scrapping the semiconductor wafers 105. The wafer disposition unit 360 generally makes a determination whether to scrap processing of certain semiconductor wafers 105, continue processing of the semiconductor wafers 105, or perform alternative processing (e.g., rework processes) on the semiconductor wafers 105 based upon the EOL predictions provided by the EOL parameter model 330. If the wafer disposition unit 360 determines that certain errors on semiconductor wafers 105 cannot be compensated by feed-forward modifications to downstream processes performed on the semiconductor wafers 105, a decision to scrap the semiconductor wafers 105 may be made. A more detailed description of the EOL parameter model 330 is provided in FIG. 5 and accompanying description below.

The process controller 310, the EOL parameter model 330, the wafer routing unit 350, the wafer disposition unit 360, and/or the FDC unit 370, may be software, hardware, or firmware unit(s) that are standalone units or may be integrated into a computer system associated with the system 300. Furthermore, the various components represented by the blocks illustrated in FIG. 3 may communicate with one another via a system communications line 315. The system communications line 315 may be a computer bus link, a dedicated hardware communications link, a telephone system communications link, a wireless communications link, or other communication links that may be implemented by those skilled in the art having benefit of the present disclosure.

Figure 4:
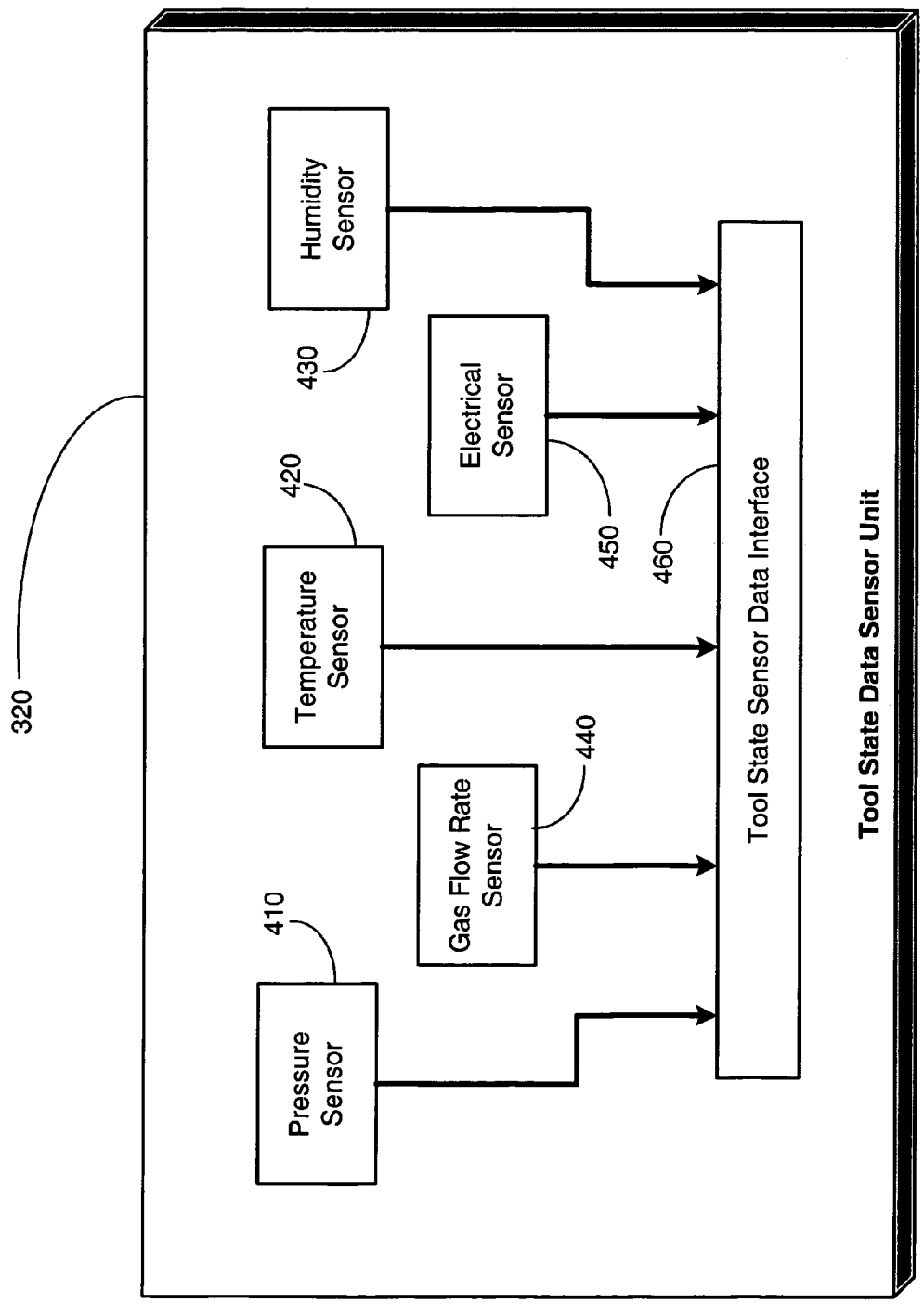
FIG. 4 illustrates a more detailed block diagram representation of a tool state data sensor unit of FIG. 3, in accordance with one illustrative embodiment of the present invention.

Turning now to FIG. 4, a more detailed block diagram depiction of the tool state data sensor unit 320 illustrated in FIG. 3 is provided. The tool state data sensor unit 320 may comprise any of a variety of different types of sensors, e.g., a pressure sensor 410, a temperature sensor 420, a humidity sensor 430, a gas flow rate sensor 440, and an electrical sensor 450, etc. In an alternative embodiment, the tool state data sensor unit 320 may comprise in situ sensors that are integrated into the processing tool 610. The pressure sensor 410 is capable of detecting the pressure within the processing tool 610. The temperature sensor 420 is capable of sensing the temperature of various portions of the processing tool 610. The humidity sensor 430 is capable of detecting the relative humidity at various portions in the processing tool 610, or of the surrounding ambient conditions. The gas flow rate sensor 440 may comprise a plurality of flow-rate sensors that are capable of detecting the flow-rate of a plurality of process gases utilized during processing of semiconductor wafers 105. For example, the gas flow rate sensor 440 may comprise sensors that can detect the flow rate of gases such as $NH_3$, $SiH_4$, $N_2$, $N_2O$, and/or other process gases.

In one embodiment, the electrical sensor 450 is capable of detecting a plurality of electrical parameters, such as the current provided to a lamp used in a photolithography process. The tool state data sensor unit 320 may also comprise other sensors capable of detecting a variety of manufacturing variables known to those skilled in the art having benefit of the present disclosure. The tool state data sensor unit 320 may also comprise a tool state sensor data interface 460. The tool state sensor data interface 460 may receive sensor data from the various sensors that are contained within, or associated with, the processing tool 610 and/or the tool state data sensor unit 320 and transmit the data to the process controller 310.

Figure 5:
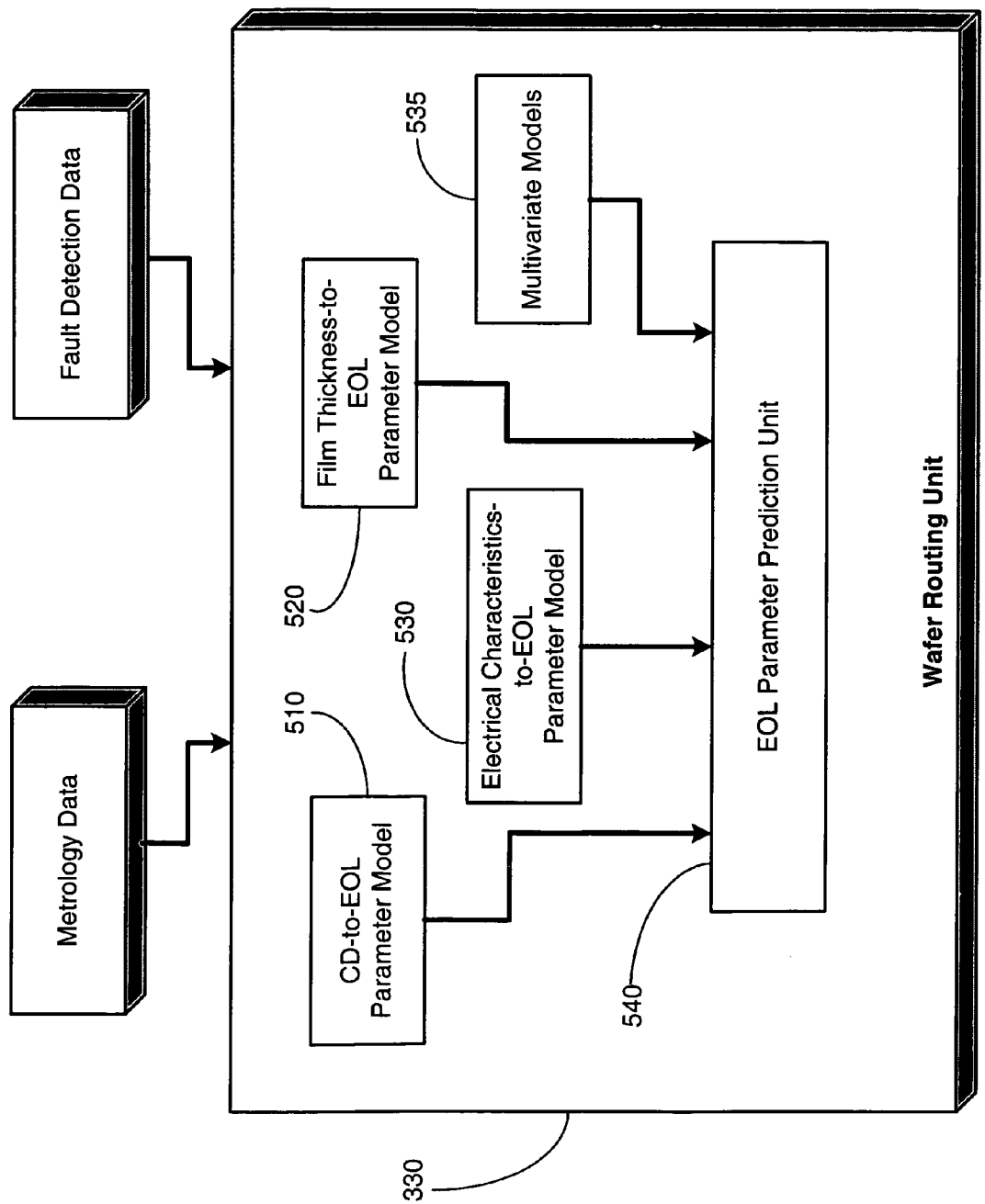
FIG. 5 illustrates a more detailed block diagram representation of a end-of-line parameter model of FIG. 3, in accordance with one illustrative embodiment of the present invention.

Turning now to FIG. 5, a more detailed block diagram illustration of the EOL parameter model 330 in accordance with embodiments of the present invention is provided. The EOL parameter model 330 may receive fault detection data and metrology data. The EOL parameter model 330 may comprise a plurality of models that relate certain in-line characteristics, such as critical dimension measurements, film thickness measurements, electrical test measurements and the like to particular EOL parameters, such as device performance or yields based upon functional performance of devices produced from the processed semiconductor wafers 105. For example, the EOL parameter model 330 may comprise a CD-to-EOL parameter model 510, a film thickness-to-EOL parameter model 520, electrical characteristics-to-EOL parameter model 530, a multivariate model 535 (which may model a combination of a plurality of inline parameter to EOL parameter(s)) and/or a plurality of other models that relate inline parameters to offline parameters.

The CD-to-EOL parameter model 510 may model certain yield characteristics based upon one or more critical dimension measurements performed on semiconductor wafers 105. The film thickness-to-EOL parameter model 520 may characterize certain yield parameters of devices produced from the processed semiconductor wafers 105 based upon film thickness data relating to one or more processed layers on the semiconductor wafers 105. Similarly, the electrical characteristics-to-EOL parameter model 530 may model yield characteristics of manufactured devices, based upon certain electrical characteristics measured on the processed semiconductor wafers 105, such as drive current, etc. Based upon the individual models 510, 520, 530, an EOL parameter prediction unit 540 may utilize the data from the models 510, 520, 530 to perform a prediction function of the overall expected yield characteristics of devices produced from the processed semiconductor wafers 105. Data from the EOL parameter prediction unit 540 may be used by the system 300 to perform dispatch and disposition functions relating to the semiconductor wafers 105 being processed by the system 300.

Figure 6:
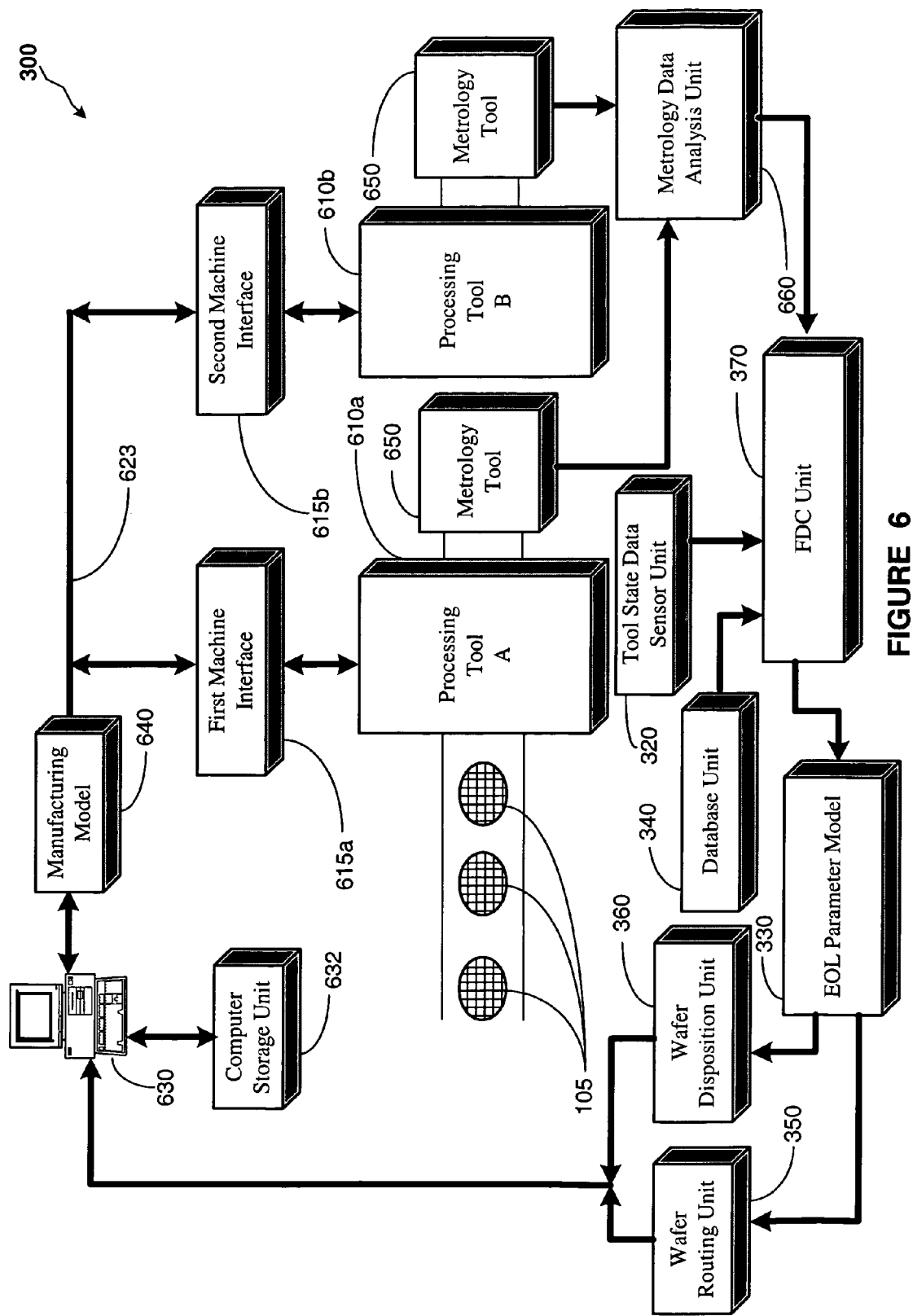
FIG. 6 illustrates a more detailed block diagram representation of the system shown in FIG. 3, in accordance with one illustrative embodiment of the present invention.

Turning now to FIG. 6, a more detailed block diagram of the system 300 in accordance with one embodiment of the present invention is illustrated. Semiconductor wafers 105 are processed on processing tools 610a, 610b using a plurality of control input signals, or manufacturing parameters, provided via a line or network 623. The control input signals, or manufacturing parameters, on the line 623 are sent to the processing tools 610a, 610b from a computer system 630 via machine interfaces 615a, 615b. The first and second machine interfaces 615a, 615b are generally located outside the processing tools 610a, 610b. In an alternative embodiment, the first and second machine interfaces 615a, 615b are located within the processing tools 610a, 610b. The semiconductor wafers 105 are provided to and carried from a plurality of processing tools 610. In one embodiment, semiconductor wafers 105 may be provided to a processing tool 610 manually. In an alternative embodiment, semiconductor wafers 105 may be provided to a processing tool 610 in an automatic fashion (e.g., robotic movement of semiconductor wafers 105). In one embodiment, a plurality of semiconductor wafers 105 is transported in lots (e.g., stacked in cassettes) to the processing tools 610.

In one embodiment, the computer system 630 sends control input signals, or manufacturing parameters, on the line 623 to the first and second machine interfaces 615a, 615b. The computer system 630 is capable of controlling processing operations. In one embodiment, the computer system 630 is a process controller. The computer system 630 is coupled to a computer storage unit 632 that may contain a plurality of software programs and data sets. The computer system 630 may contain one or more processors (not shown) that are capable of performing the operations described herein. The computer system 630 employs a manufacturing model 640 to generate control input signals on the line 623. In one embodiment, the manufacturing model 640 contains a manufacturing recipe that determines a plurality of control input parameters that are sent on the line 623 to the processing tools 610a, 610b.

In one embodiment, the manufacturing model 640 defines a process script and input control that implement a particular manufacturing process. The control input signals (or control input parameters) on the line 623 that are intended for processing tool A 610a are received and processed by the first machine interface 615a. The control input signals on the line 623 that are intended for processing tool B 610b are received and processed by the second machine interface 615b. Examples of the processing tools 610a, 610b used in semiconductor manufacturing processes are steppers, etch process tools, deposition tools, and the like.

One or more of the semiconductor wafers 105 that are processed by the processing tools 610a, 610b can also be sent to a metrology tool 650 for acquisition of metrology data. The metrology tool 650 may be a scatterometry data acquisition tool, an overlay-error measurement tool, a critical dimension measurement tool, and the like. In one embodiment, a metrology tool 650 examines one or more processed semiconductor wafers 105. The metrology data analysis unit 660 may collect, organize, and analyze data from the metrology tool 650. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 610.

As provided above, the EOL parameter model 330 may receive data from a plurality of entities, such as the metrology data analysis unit 660, fault detection data from the FDC unit 370, which may perform fault detection based upon data from the tool state data sensor unit 320. The EOL parameter model 330 may also receive stored data relating to processed semiconductor wafers 105 from the database unit 340. Based upon the data received by the EOL parameter model 330, data relating to the routing and disposition of semiconductor wafers 105 may be generated by the EOL parameter model 330. The wafer routing unit 350 and the wafer disposition unit 360 may receive data from the EOL parameter model 330 and perform wafer routing schedule modifications and/or wafer disposition decisions. Data from the wafer routing unit 350 and the wafer disposition unit 360 may be received by the computer system 630, which may invoke the semiconductor wafer 105 routing modifications and/or the semiconductor wafer 105 disposition modifications.

Figure 7:
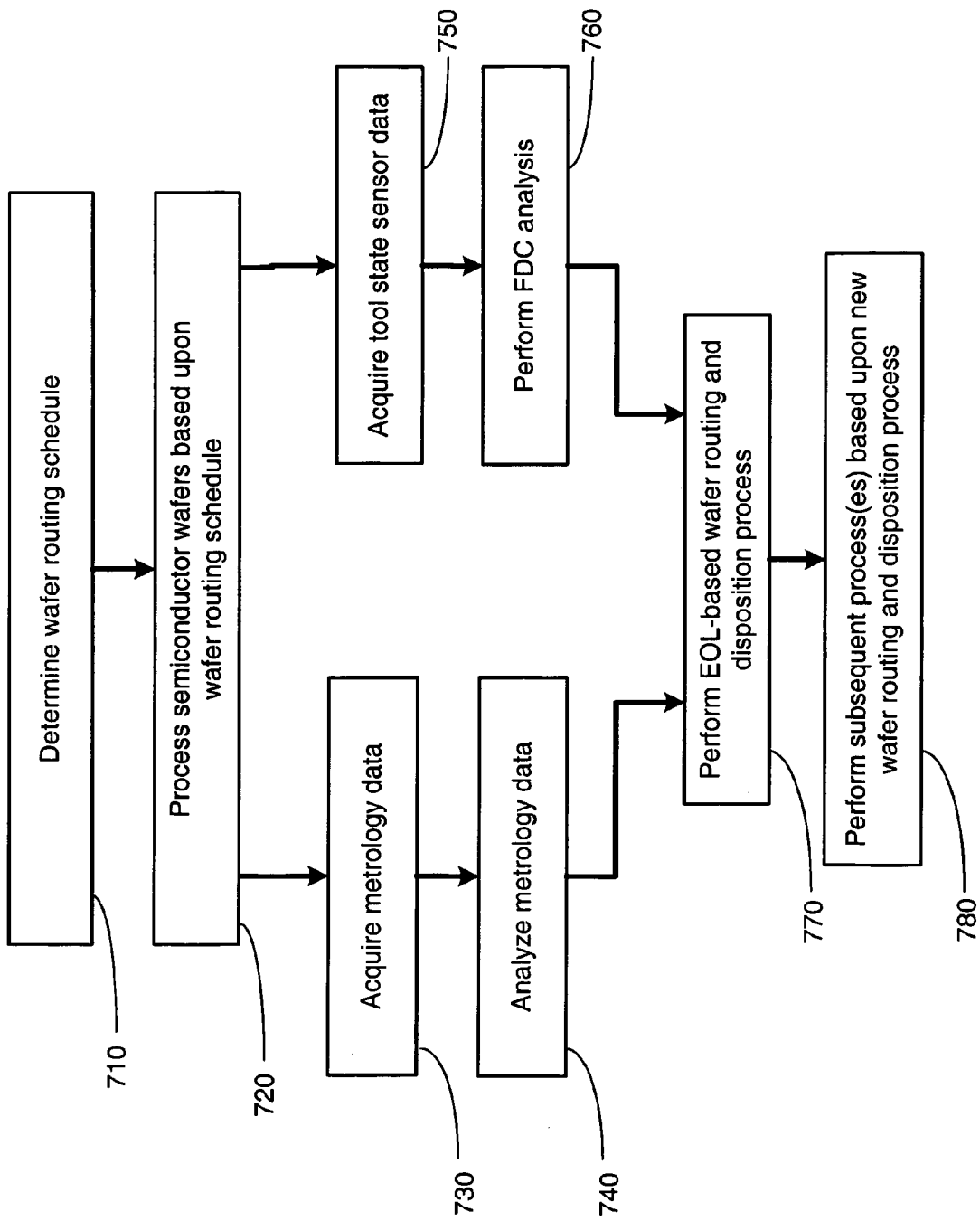
FIG. 7 illustrates a flowchart depiction of a method in accordance with one illustrative embodiment of the present invention.

Turning now to FIG. 7, a flowchart illustration of the method in accordance with embodiments of the present invention is illustrated. The system 300 may determine a wafer routing scheme or plan to generate a wafer routing regime, which may be used to route a plurality of semiconductor wafers 105 and/or batches of semiconductor wafers 105 throughout a manufacturing facility associated with the system 300 (block 710). Based upon the routing scheme, the system 300 may process semiconductor wafers 105 (block 720). Upon processing one or more semiconductor wafers 105, the system 300 may acquire metrology data 730. The metrology data may be used by the system 300 to perform analysis to examine any errors on the processed semiconductor wafers 105 (block 740).

Additionally, the system 300 may acquire tool state data during the processing of semiconductor wafers 105 (block 750). The system 300 may perform a fault detection and classification function/analysis based upon the data acquired by the tool state sensors (block 760). The fault detection and classification analysis may include detecting faults relating to processing tools 610 during processing, and classifying such faults for later retrieval. Upon analysis of the metrology data and/or fault detection analysis, the system 300 may perform an EOL analysis-based wafer routing and disposition process (block 770). The wafer routing and disposition process may provide routing modification data and/or wafer disposition instructions to the system 300. A more detailed flow chart illustration of performing the wafer routing and disposition process indicated in block 770 of FIG. 7 is provided in FIG. 8 and accompanying description below. Upon performing the wafer routing and disposition process, the system 300 may then perform subsequent processes based upon new routing and disposition information (block 780).

Figure 8:
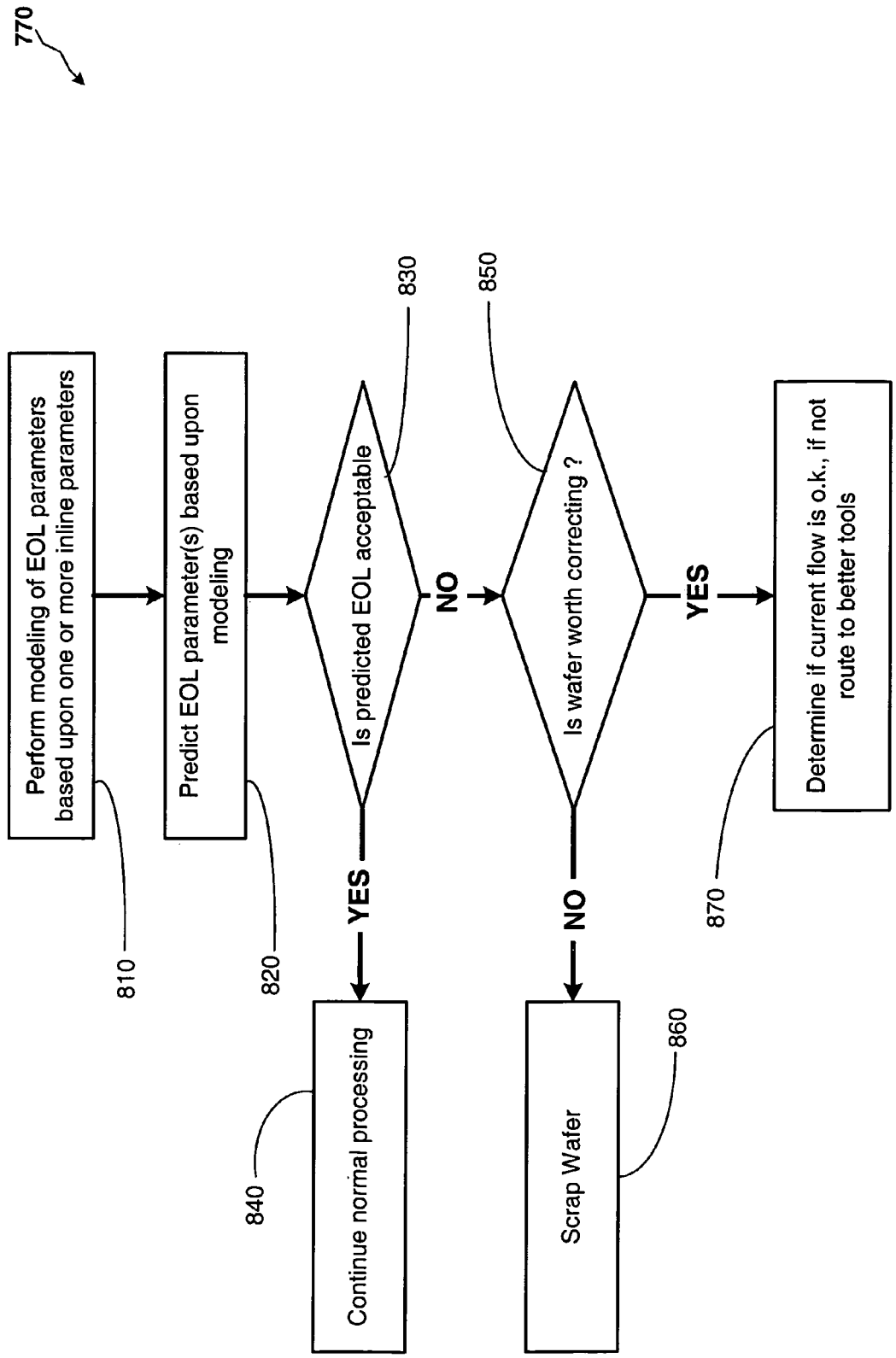
FIG. 8 illustrates a more detailed flowchart depiction of a method of performing an end-of-line parameter based wafer routing and disposition process, as indicated in FIG. 7, in accordance with one illustrative embodiment of the present invention.

Turning now to FIG. 8, a more detailed flowchart depiction of performing the wafer routing and disposition process indicated in block 770 of FIG. 7 is illustrated. The system 300 may perform modeling of one or more EOL parameters based upon one or more inline parameters (block 810). For example, the system 300 may model a functional yield of devices manufactured from the processed semiconductor wafers 105, based upon a modeling that takes into account inline characteristic(s) of processed semiconductor wafers 105, such as critical dimension measurements, film thickness measurements, electrical characteristics, and the like. The system 300 then makes a prediction of the EOL parameters based upon the modeling (block 820). The prediction may lead to a quantification of the yield of devices produced from the semiconductor wafers 105 being processed.

The system 300 may determine whether the predicted EOL parameters are within a predetermined acceptable range (block 830). The determination may take into account several factors, such as minimum performance standards of devices to be produced from the semiconductor wafers 105, the reduced value of inferior devices processed from the semiconductor wafers 105, the cost of continuing to process low performance devices, etc.

Based upon a determination that the EOL parameter is within an acceptable range, the system 300 may continue to perform normal processing such as routing and disposition decisions made early (block 840). However, if the system 300 determines that the predicted EOL parameters may not be within an acceptable predetermined range, the system 300 may make another determination whether the semiconductor wafers 105 are to be further processed for corrections, based on economic factors (block 850). For example, the system 300 may determine that although rework may be possible to correct certain errors on processed semiconductor wafers 105, the predicted yield is sufficiently low such that rework may be inefficient and it may be more economically feasible not to perform corrections on the semiconductor wafers 105. When the system 300 determines that the semiconductor wafers 105 may not be worth correcting, the system 300 may scrap the semiconductor wafers 105 (block 860). If the system 300 determines that the semiconductor wafers 105 is worth correcting, the system 300 may determine whether the current process flow is sufficient to make the correction or re-routing of the semiconductor wafers 105 to selected processing tools 610 may be required. Based upon such data, routing and disposition decisions are made by the system 300. Completion of the steps described in FIG. 8 substantially completes the routing and disposition process indicated in block 770 of FIG. 7.

Utilizing the disclosure of the present invention, efficient routing and disposition of semiconductor wafers 105 based upon the quality of the semiconductor wafers 105 being processed may be made, predetermined routing may be modified based upon predicted EOL parameters, such as yield of devices produced by the processed semiconductor wafers 105. Additionally, business rules may be used to determine whether it may be economically beneficial to scrap certain semiconductor wafers 105 rather than continue to process and correct errors based upon predicted yield results. Utilizing embodiments of the present invention more efficient routing and disposition of semiconductor wafers 105 is promoted.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
performing a process step upon a workpiece based upon a predetermined routing plan;
modeling an end-of-line parameter based upon said process performed upon said workpiece, said modeling an end-of-line parameter comprising performing a modeling of a function characteristic of said workpiece, said modeling of a function characteristic being performed in relation to said process step; and
performing a workpiece routing process based upon said modeling an end-of-line parameter, said workpiece routing process comprising using a controller to modify said routing plan.

2. The method of claim 1, wherein performing said process step upon said workpiece further comprises performing said process step upon a semiconductor wafer.

3. The method of claim 1, wherein performing a process step upon a workpiece based upon a predetermined routing plan further comprises routing said workpiece throughout a manufacturing facility for processing.

4. The method of claim 1, wherein modeling an end-of-line parameter based upon said process performed upon said workpiece further comprises performing at least one of a metrology data analysis and a fault detection analysis.

5. The method of claim 4, wherein modeling an end-of-line parameter based upon said process performed upon said workpiece further comprises predicting at least one parameter relating to a device manufactured from said workpiece based upon at least one of said metrology data analysis and said fault detection analysis.

6. The method of claim 5, wherein predicting at least one parameter relating to a device manufactured from said workpiece further comprises predicting at least one of a yield relating to said device manufactured from said workpiece and a performance relating to said device.

7. The method of claim 4, wherein performing said metrology data analysis further comprises acquiring metrology data relating to said workpiece.

8. The method of claim 7, wherein acquiring metrology data relating to said workpiece further comprises acquiring at least one of a critical dimension (CD) data relating to a structure formed on said workpiece, a film thickness data relating to a layer on said workpiece, and an electrical characteristic data relating to said workpiece.

9. The method of claim 8, wherein modeling an end-of-line parameter based upon said process performed upon said workpiece further comprises performing at least one of a CD-to-EOL parameter modeling, a film thickness-to-EOL parameter modeling, an electrical characteristic EOL modeling, and a multivariate modeling.

10. The method of claim 4, wherein performing a fault detection analysis comprises acquiring tool state data.

11. The method of claim 10, wherein acquiring said tool state data further comprises acquiring at least one of a pressure data, a temperature data, a humidity data, and a gas flow rate data relating to said process step performed upon said workpiece.

12. The method of claim 4, wherein performing a workpiece routing process further comprises routing said workpiece to an alternative manufacturing process based upon said modeling of said end-of-line parameter.

13. The method of claim 4, wherein performing a workpiece routing process further comprises determining to scrap said workpiece based upon said modeling of said EOL parameter.

14. A method, comprising:
performing a process step upon a workpiece;
acquiring metrology data relating to said workpiece;
acquiring tool state data relating to said process performed upon said workpiece;
performing fault detection analysis based upon said metrology data and said tool state data;
modeling an end-of-line parameter based upon said fault detection analysis, said modeling an end-of-line parameter comprising performing a modeling of a function characteristic of said workpiece said modeling of a function characteristic being performed in relation to said process step; and
performing a workpiece routing process based upon modeling said end-of-line (EOL) parameter, said workpiece routing process comprising using a controller to determine a routing of said workpiece and specifying a routing plan based upon a new requirement.

15. The method of claim 14, wherein performing said process step upon said workpiece further comprises performing said process step upon a semiconductor wafer.

16. An apparatus, comprising:
means for performing a process step upon a workpiece based upon a predetermined routing plan;
means for modeling an end-of-line parameter based upon said process performed upon said workpiece, said modeling an end-of-line parameter comprising performing a modeling of a function characteristic of said workpiece said modeling of a function characteristic being performed in relation to said process step; and
means for performing a workpiece routing process based upon modeling an end-of-line (EOL) parameter, said workpiece routing process comprising using a controller to modify said routing plan.

17. A system, comprising:
a processing tool to process a workpiece based upon a routing plan; and
a process controller operatively coupled to said processing tool, said process controller to perform a workpiece routing process based upon a fault detection analysis comprising modeling an end-of-line (EOL) parameter relating to said workpiece, said modeling an end-of-line parameter comprising performing a modeling of a function characteristic of said workpiece, said modeling of a function characteristic being performed in relation to said process, said workpiece routing process comprising determining a route of said workpiece and modifying said routing plan.

18. The system of claim 17, wherein said workpiece is a semiconductor wafer.

19. The system of claim 17, further comprising:
a tool state data sensor unit operatively coupled to said process controller and to said processing tool, said tool state data sensor unit to acquire tool state data relating to an operation performed by said processing tool;
a metrology tool operatively coupled to said process controller and to said processing tool, said metrology tool to acquire metrology data relating to said workpiece processed by said processing tool;

a fault detection and classification (FDC) unit operatively coupled to said process controller, said fault detection and classification unit to perform a fault detection process;

an end-of-line (EOL) parameter model operatively coupled to said process controller, said EOL parameter model is capable of modeling said EOL parameter based upon said fault detection process; and a wafer routing unit and a wafer disposition unit operatively coupled to said process controller and to said FDC unit, said wafer routing unit and said wafer disposition unit to perform a routing/disposition of said workpiece based upon said modeling of said EOL parameter.

20. The system of claim 19, further comprising a database unit to store at least one of said metrology data, said tool state data, and an electrical test data acquired from performing an electrical test upon said workpiece.

21. The system of claim 20, wherein said tool state data sensor unit comprises at least one of a pressure sensor, gas flow sensor, temperature sensor, humidity sensor, and an electrical sensor.

22. An apparatus, comprising:

a process controller operatively coupled to perform a workpiece routing process based upon a fault detection analysis comprising modeling an end-of-line (EOL) parameter relating to a workpiece, said modeling an end-of-line parameter comprising performing a modeling of a function characteristic of said workpiece, said modeling of a function characteristic being performed in relation to said process, said workpiece routing process comprising determining a disposition of said workpiece and modifying a routing plan.

23. The apparatus of claim 22, wherein said workpiece is a semiconductor wafer.

24. The apparatus of claim 22, further comprising:

a tool state data sensor unit operatively coupled to said process controller and to a processing tool, said tool state data sensor unit to acquire tool state data relating to an operation performed by said processing tool;

a metrology tool operatively coupled to said process controller and to said processing tool, said metrology tool to acquire metrology data relating to a workpiece processed by said processing tool;

a fault detection and classification (FDC) unit operatively coupled to said process controller, said fault detection and classification unit to perform a fault detection process;

an end-of-line (EOL) parameter model operatively coupled to said process controller, said EOL parameter model is capable of modeling said EOL parameter based upon said fault detection process; and a wafer routing unit and a wafer disposition unit operatively coupled to said process controller and to said FDC unit, said wafer routing unit and said wafer disposition unit to perform a routing/disposition of said workpiece based upon said modeling of said EOL parameter.

25. The apparatus of claim 24, wherein said tool state data sensor unit comprises at least one of a pressure sensor, gas flow sensor, temperature sensor, humidity sensor, and an electrical sensor.

26. A computer readable program storage device encoded with instructions that, when executed by a computer, performs a method, comprising:

performing a process step upon a workpiece based upon a predetermined routing plan;

modeling an end-of-line parameter based upon said process step performed upon said workpiece, said modeling an end-of-line parameter comprising performing a modeling of a function characteristic of said workpiece, said modeling of a function characteristic being performed in relation to said process step; and performing a workpiece routing process based upon said modeling an end-of-line parameter, said workpiece routing process comprising using a controller to modify said routing plan.

27. The computer readable program storage device encoded with instructions that, when executed by a computer, performs the method of claim 26, wherein performing said process step upon said workpiece further comprises performing said process step upon a semiconductor wafer.

28. The computer readable program storage device encoded with instructions that, when executed by a computer, performs the method of claim 26, wherein performing a process step upon a workpiece based upon a predetermined routing plan further comprises routing said workpiece throughout a manufacturing facility for processing.

29. The computer readable program storage device encoded with instructions that, when executed by a computer, performs the method of claim 26, wherein modeling an end-of-line parameter based upon said process performed upon said workpiece further comprises performing at least one of a metrology data analysis and a fault detection analysis.

30. The computer readable program storage device encoded with instructions that, when executed by a computer, performs the method of claim 29, wherein modeling an end-of-line parameter based upon said process performed upon said workpiece further comprises predicting at least one parameter relating to a device manufactured from said workpiece based upon at least one of said metrology data analysis and said fault detection analysis.

31. The computer readable program storage device encoded with instructions that, when executed by a computer, performs the method of claim 30, wherein predicting at least one parameter relating to a device manufactured from said workpiece further comprises predicting at least one of a yield relating to said device manufactured from said workpiece and a performance relating to said device.

32. The computer readable program storage device encoded with instructions that, when executed by a computer, performs the method of claim 29, wherein performing said metrology data analysis further comprises acquiring metrology data relating to said workpiece.

33. The computer readable program storage device encoded with instructions that, when executed by a computer, performs the method of claim 32, wherein acquiring metrology data relating to said workpiece further comprises acquiring at least one of a critical dimension (CD) data relating to a structure formed on said workpiece, a film thickness data relating to a layer on said workpiece, and an electrical characteristic data relating to said workpiece.

34. The computer readable program storage device encoded with instructions that, when executed by a computer, performs the method of claim 33, wherein modeling an end-of-line parameter based upon said process performed upon said workpiece further comprises performing at least one of a CD-to-EOL parameter modeling, a film thickness-to-EOL parameter modeling, and an electrical characteristic EOL modeling.

35. The computer readable program storage device encoded with instructions that, when executed by a computer, performs the method of claim 29, wherein performing a fault detection analysis comprises acquiring tool state data.

36. The computer readable program storage device encoded with instructions that, when executed by a computer, performs the method of claim 35, wherein acquiring said tool state data further comprises acquiring at least one of a pressure data, a temperature data, a humidity data, and a gas flow rate data relating to said process step performed upon said workpiece.

37. The computer readable program storage device encoded with instructions that, when executed by a computer, performs the method of claim 29, wherein performing a workpiece routing process further comprises routing said workpiece to an alternative manufacturing process based upon said modeling of said EOL parameter.

38. The computer readable program storage device encoded with instructions that, when executed by a computer, performs the method of claim 29, wherein performing a workpiece routing process further comprises determining to scrap said workpiece based upon said modeling of said EOL parameter.

\* \* \* \* \*